United States Patent
Borkenhagen et al.

(10) Patent No.: US 6,600,347 B2
(45) Date of Patent: Jul. 29, 2003

(54) DYNAMICALLY PRODUCING AN EFFECTIVE IMPEDANCE OF AN OUTPUT DRIVER WITH A BOUNDED VARIATION DURING TRANSITIONS THEREBY REDUCING JITTER

(75) Inventors: John Michael Borkenhagen, Rochester, MN (US); Moises Cases, Austin, TX (US); Daniel Mark Dreps, Georgetown, TX (US); David LeRoy Guertin, Rochester, MN (US); Nam Huu Pham, Round Rock, TX (US); Robert Russell Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/974,686

(22) Filed: Oct. 10, 2001

(65) Prior Publication Data

US 2003/0067327 A1 Apr. 10, 2003

(51) Int. Cl.[7] ................................................ H03B 1/00
(52) U.S. Cl. ........................ 327/112; 327/391; 327/401; 326/27; 326/87
(58) Field of Search ................. 327/108–112, 374–377, 327/379–382, 387, 389, 391–396, 398, 399, 401, 404, 319; 326/21–24, 26–31, 34, 82, 83, 86, 87; 307/412; 365/189.05, 230.08

(56) References Cited

U.S. PATENT DOCUMENTS

| | | | | |
|---|---|---|---|---|
| 5,061,864 A | | 10/1991 | Rogers | 326/17 |
| 5,140,194 A | * | 8/1992 | Okitaka | 326/121 |
| 5,278,803 A | | 1/1994 | Wanner | 365/233 |
| 5,298,866 A | | 3/1994 | Kaplinsky | 327/261 |
| 5,416,918 A | | 5/1995 | Gleason et al. | 713/501 |
| 5,585,742 A | | 12/1996 | Kamiya | 326/56 |
| 5,767,698 A | | 6/1998 | Emeigh et al. | 326/83 |
| 5,818,263 A | | 10/1998 | Ashuri | 326/93 |
| 5,838,186 A | * | 11/1998 | Inoue et al. | 326/27 |
| 5,877,647 A | * | 3/1999 | Vajapey et al. | 326/27 |
| 5,894,226 A | | 4/1999 | Koyama | 324/765 |
| 6,075,395 A | | 6/2000 | Saeki | 327/161 |
| 6,141,292 A | | 10/2000 | Lee et al. | 365/233 |
| 6,320,433 B1 | * | 11/2001 | Hinterscher | 326/27 |

OTHER PUBLICATIONS

Means of Increasing Yield On Logic Chips, IBM Technical Disclosure Bulletin, Jun. 1990, p. 1.*

* cited by examiner

Primary Examiner—Minh Nguyen
(74) Attorney, Agent, or Firm—Winstead Sechrist & Minick

(57) ABSTRACT

A method and system for reducing a reflection coefficient below a predetermined value thereby reducing jitter by the variation of the effective impedance of a driver appearing to be bounded during state transitions. The driver may include a pull-up driver and a pull-down driver. In the pull-up driver, the transistors may be switched from a first state to a second state in a staggered fashion where the first state is complementary to the second state; In the pull-down driver, the transistors may be switched from a second state to a first state in a staggered fashion. By staggering the switching of the transistors in the pull-up driver and the pull-down driver, a portion of the current may flow from the pull-up driver to the pull-down driver thereby causing the variation of the effective impedance of the driver to appear to be bounded during state transitions.

2 Claims, 4 Drawing Sheets

DYNAMICALLY PRODUCING AN EFFECTIVE IMPEDANCE OF AN OUTPUT DRIVER WITH A BOUNDED VARIATION DURING TRANSITIONS THEREBY REDUCING JITTER

TECHNICAL FIELD

The present invention relates to the field of output drivers, and more particularly to producing an effective impedance of the output driver with a bounded variation during state transitions that sufficiently reduces a reflection coefficient below a predetermined value thereby reducing jitter by reducing reflections on the transmission line.

BACKGROUND INFORMATION

Microprocessor core fabrication technology is still evolving rapidly, and advancing at a much faster rate than fabrication technology of other devices. Device geometries within the core logic of microprocessors are shrinking, and power supply voltages must be lowered to accommodate small device geometries. Current silicon technology, using CMOS (Complementary Metal Oxide Semiconductor) transistors, has reduced the required junction threshold voltage to approximately zero volts. The current low voltage logic standards are 1.8 volts and 3.3 volts. Presently available ASIC (Application Specific Integrated Circuits) interface and support circuits have relatively high voltage requirements due to device geometries.

For example, it is possible for normal operating voltages in a microprocessor to range between zero volts and 1.8 volts, while normal operating voltages in other devices range between zero volts and 3.3 volts. In such a situation, a logic one state is represented by 1.8 volts in the microprocessor and by 3.3 volts in the other devices. In either case, a logic zero state is represented by zero volts.

Presently, in order to communicate a logic high state between the processor and other devices, system busses transfer a signal of, nominally, 3.3 volts for a logic one. For this reason, the processor includes driver circuitry for translating a 1.8 volt logic high signal from the core logic within the microprocessor into a 3.3 volt signal for communicating a logic high through the system bus. Likewise, the microprocessor includes driver circuitry for translating a 3.3 volt logic high signal from the system bus into a 1.8 volt logic high signal for use elsewhere within the microprocessor. Such driver circuitry may commonly be referred to as an output driver.

Conventional output drivers may interface with various input/output (I/O) devices such as ASICs, SRAMs (Static Random Access Memories), etc. A bus, which is a transmission line, may couple the output driver with the I/O device. In conventional output drivers, data may be transmitted at a single data rate. That is, output drivers may transmit one bit per cycle on the bus to the I/O device. When the output driver is ready to transmit another bit on the bus to the I/O device, the current in the bus may have been eliminated. Since there may be no current in the bus, there may not be a reflection of the data signal.

However, if output drivers transmit data at a higher data rate, i.e., at a rate of multiple bits per cycle, on the bus to an I/O device, reflections may occur. Since more than one bit per cycle is being transmitted on the bus, the current in the bus may not be eliminated prior to the output driver transmitting another data signal. Subsequently, the data signal may be reflected from the I/O device towards the output driver. The reflected data signal may not be terminated at the output driver end since the effective impedance of the output driver may appear to be substantially higher than the characteristic impedance of the bus, i.e., the transmission line, during the transition of the output driver, i.e., when the output driver switches from high to low or from low to high. Thus, the reflection coefficient may approach the value of one so that all of the energy in the reflected data signal gets reflected back towards the I/O device. That is, the reflected data signal may not be terminated but reflected back to the I/O device.

When the reflected data signal gets reflected back against the I/O device, Inter-Symbol Interference (ISI) may be said to occur. ISI may refer to the reflective noise on the cycle interfering with the next cycle or cycles. Subsequently, the data signal may become distorted where the distortion of this type may commonly be referred to as jitter.

However, if the effective impedance of the output driver appears finite so that the reflection coefficient is sufficiently less than one, then the reflected data signal may be terminated and hence jitter may be reduced.

It would therefore be desirable to produce an effective impedance of the output driver during state transitions that does not appear to be substantially greater than the bus characteristic impedance, i.e., appears to have a bounded variation, thereby reducing jitter by reducing reflections on the transmission line. That is, it would be desirable to produce an effective impedance of the output driver with a bounded variation during state transitions that reduces the reflection coefficient below a predetermined value so that the reflections on the transmission line may be reduced thereby reducing jitter.

SUMMARY

The problems outlined above may at least in part be solved in some embodiments by allowing a portion of the current to flow from a pull-up driver through the impedance of the output stage of the driver to a pull-down driver thereby causing the effective impedance of the driver to not appear to be substantially higher than the characteristic impedance of a bus thereby reducing jitter. That is, the variation of the effective impedance of the driver may be bounded during state transitions thereby producing a reflection coefficient that is below a predetermined value. When the reflection coefficient is less than a predetermined value, then a signal reflected from a receiver, coupled to the driver via a bus, may be terminated at the driver. That is, when the reflection coefficient is less than a predetermined value, then not all of the energy in the reflected signal gets reflected back towards the receiver. The predetermined value may establish the maximum tolerable jitter.

In one embodiment of the present invention, a driver may be coupled to a receiver, e.g., Input/Output (I/O) device, via a bus. The driver may be configured to receive a data signal that results in the driver driving a pad to a logic high voltage level, referred to as a logic 1, or to a logic low voltage level, referred to as a logic 0. The pad may refer to an interface between circuitry external and internal to a driver. The driver may comprise slew rate controllers configured to control the slew, i.e., rate, at which the pad switches. The driver may further comprise two series connected pull drivers, a pull-up driver and a pull-down driver. The pull-up driver may be configured to drive the pad to a logic high voltage level; whereas, the pull-down driver may be configured to drive the pad to a logic low voltage level.

Both the pull-up driver and the pull-down driver may comprise a plurality of segmented transistors. In the pull-up driver, the transistors may be switched from a first state, e.g., deactivated state, to a second state, e.g., activated state, in a staggered fashion where the first state is complementary to the second state. That is, each transistor may be switched to the second state at a different point in time. In the pull-down driver, the transistors may be switched from a second state, e.g., activated state, to a first state, e.g., deactivated state, in a staggered fashion. That is, each transistor may be switched to the first state at a different point in time.

Each transistor in the pull-up driver may be associated with a particular transistor in the pull-down driver. Upon switching a particular transistor in the pull-up driver to the second state, the associated transistor in the pull-down driver may switch to the first state at substantially the same time. By staggering the switching of the transistors to the second state in the pull-up driver and hence staggering the switching of the transistors to the first state in the pull-down driver, a portion of the current may flow from the pull-up driver through the impedance of the output stage of the driver and then through the pull-down driver. The other portion of the current may flow from the pull-up driver through the impedance of the output stage of the driver and then out to the pad. By allowing a portion of the current to flow from the pull-up driver to the pull-down driver, the effective impedance of the driver may not appear to be substantially higher than the characteristic impedance of the bus thereby reducing jitter. That is, the variation of the effective impedance of the driver may appear to be bounded during switching of the pad thereby producing a reflection coefficient that is below a predetermined value. When the reflection coefficient is less than the predetermined value, then a signal reflected from the receiver, e.g., I/O device, may be terminated at the driver. That is, when the reflection coefficient is less than the predetermined value, then not all of the energy in the reflected signal is reflected back towards the receiver.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

A better understanding of the present invention can be obtained when the following detailed description is considered in conjunction with the following drawings, in which.

DETAILED DESCRIPTION

Figure 1:
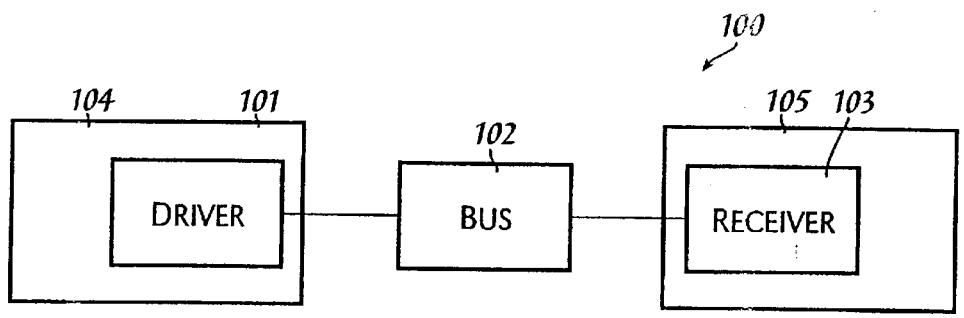
FIG. 1 illustrates a communication system configured in accordance with the present invention.

FIG. 1—Communication System

FIG. 1 illustrates one embodiment of the present invention of a communication system 100. Communication system 100 may comprise a driver 101 coupled to a receiver 103 via a bus 102. Driver 101 may reside within an integrated circuit 104, e.g., processing unit. Driver 101 may be configured to transmit and receive data to and from receiver 103. Driver 101 may be configured to transmit data at a data rate higher than a single data rate, i.e., transmit more than one bit per cycle, to receiver 103. Receiver 103 may reside within an integrated circuit 105, e.g., main storage control unit, storage control unit, floating point unit, input/output processor, synchronous dynamic random access memory. Receiver 103 may be configured to receive and transmit data from and to driver 101. Receiver 103 may be an Input/Output (110) device such as an ASIC (Application Specific Integrated Circuit), SRAM (Synchronous Random Access Memory), etc. It is noted that communication system 100 may comprise any number of drivers 101 and receivers 103 and that FIG. 1 is illustrative. It is further noted that the bus 102 connecting driver 101 and receiver 103 may be any medium type, e.g., wired. It is further noted that communication system 100 may be any type of system that has at least one driver and at least one receiver and that FIG. 1 is not to be limited in scope to any one particular embodiment.

FIG. 2—Driver

Figure 2:
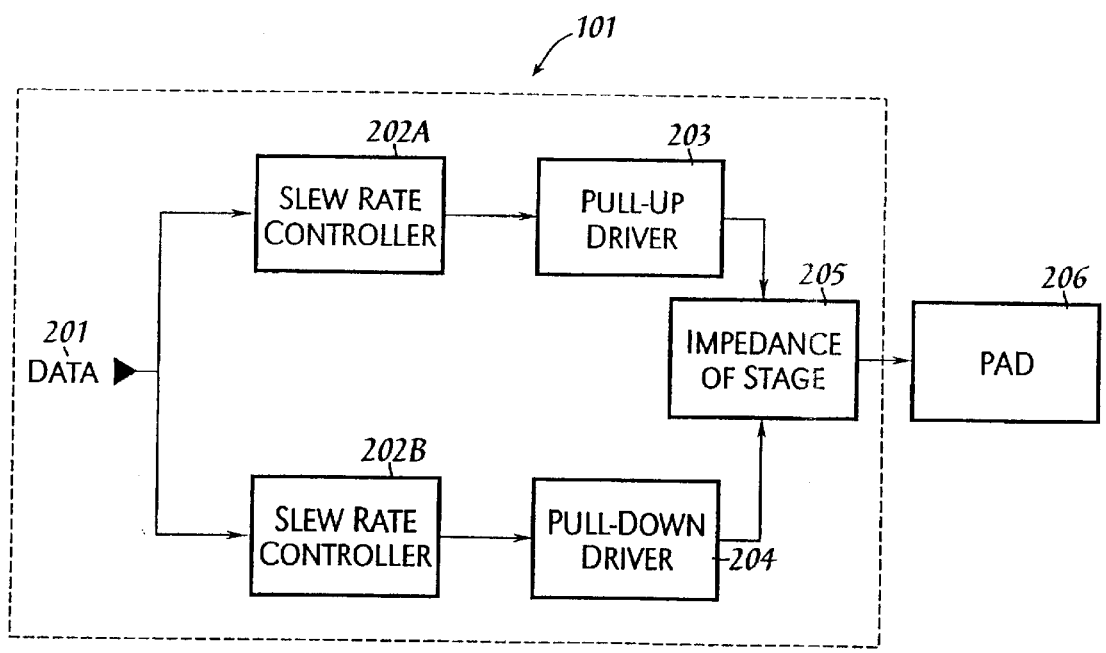
FIG. 2 illustrates an embodiment of the present invention of a driver in a communication system.

FIG. 2 illustrates a typical hardware configuration of driver 101. As stated above, driver 101 may be configured to transmit data signals to a receiver 103 (FIG. 1). Driver 101 may be configured to receive a data signal 201 that results in driver 101 driving a pad 206 to a logic high voltage level, referred to as a logic 1, or to a logic low voltage level, referred to as a logic 0. Pad 206 may refer to an interface between circuitry external and internal to driver 101.

Driver 101 may comprise slew rate controllers 202A–B configured to control the slew, i.e., rate, at which pad 206 switches. A further description of slew rate controllers is provided in the discussion of FIG. 3.

Driver 101 may further comprise two series connected pull drivers, a pull-up driver 203 and a pull-down driver 204. A more detailed description of pull-up driver 203 and pull-down driver 204 is provided in the description of FIG. 3. Pull-up driver 203 may be configured to drive pad 206 to a logic high voltage level; whereas, pull-down driver 204 may be configured to drive pad 206 to a logic low voltage level.

Pull-up driver 203 may comprise a plurality of segmented transistors, e.g., p-channel Field Effect Transistors (PFET's). Pull-down driver 204 may comprise the same number of segmented transistors, e.g., n-channel Field Effect Transistors (NFET's), as in pull-up driver 203. As stated above, additional discussion of pull-up driver 203 and pull-down driver 204 is provided in the description of FIG. 3.

As stated in the Background Information section, a reflected data signal from an I/O device may not be terminated at the output driver end since the effective impedance of the output driver may appear to be substantially higher than the characteristic impedance of the bus, i.e., the transmission line, during the transition of the output driver, i.e., when the pad switches from high to low or from low to high. Since the effective impedance of the output driver appears to be substantially higher than the characteristic impedance of the bus, the reflection coefficient may approach the value of one so that all of the energy in the reflected data signal gets reflected back towards the I/O device. That is, the reflected data signal may not be terminated but reflected back to the I/O device.

The impedance of the output stage of the driver may appear to be substantially higher than the characteristic impedance of the bus when all the current flows from pull-up driver through the impedance of the output stage of driver and then out to the pad. By allowing all the current to flow from the pull-up driver out to the pad, the characteristic impedance of the driver appears to be substantially higher than the characteristic impedance of the bus during transitions of the driver. However, as explained in greater detail in the description of FIG. 3, pull-up driver 203 and pull-down driver 204 may be configured so that a portion of the current flows from pull-up driver 203 through the impedance 205 of the output stage of driver 101 and then through pull-down driver 204 thereby producing an effective impedance of driver 101 during the switching of pad 206 that does not appear to be substantially higher than the characteristic impedance of bus 102 thereby reducing jitter. That is, the variation of the effective impedance of driver 101 may appear to be bounded during switching of pad 206 thereby producing a reflection coefficient that is below a predetermined value. When the reflection coefficient is less than the predetermined value, then a signal reflected from receiver 103, e.g., I/O device, may be terminated at driver 101. That is, when the reflection coefficient is less than the predetermined value, then not all of the energy in the reflected signal gets reflected back towards receiver 103. The predetermined value may establish the maximum tolerable jitter.

The reflection coefficient, Γ, may be defined as follows:

$$\Gamma = \frac{|Z_L - Z_o|}{Z_L + Z_o}$$

where $Z_L$ is the effective impedance of driver 101 and $Z_o$ is the characteristic impedance of bus 102. The closer the effective impedance of driver 101 matches the characteristic impedance of bus 102 the smaller the reflection coefficient and the less energy in the reflected signal that gets reflected back towards receiver 103. By tuning and testing, engineers may determine what is the maximum desired effective impedance of driver 101, $Z_L$, in order to attain a sufficiently low reflection coefficient in order to attain a maximum tolerable jitter. A predetermined value for the reflection coefficient may then be determined to determine if jitter is sufficiently reduced. A reflection coefficient value greater than the predetermined value may represent a case when jitter is not sufficiently reduced. A reflection coefficient value less than the predetermined value may represent a case when jitter is sufficiently reduced. For example, if the characteristic impedance of bus 102, $Z_o$, is 35 Ω, the nominal impedance of driver 101 is 35 Ω, and the maximum desired effective impedance of driver 101, $Z_L$, is 130 Ω, in order to sufficiently reduce jitter, then a predetermined value for the reflection coefficient may be the value of 0.576=((130−35)/(130+35)). By producing an effective impedance of driver 101 that appears to be substantially constant during switching of pad 206 as described below, i.e., producing an effective impedance that has a bounded variation about the nominal impedance, 35 Ω, the reflection coefficient may be below the predetermined value thereby reducing jitter.

Figure 3:
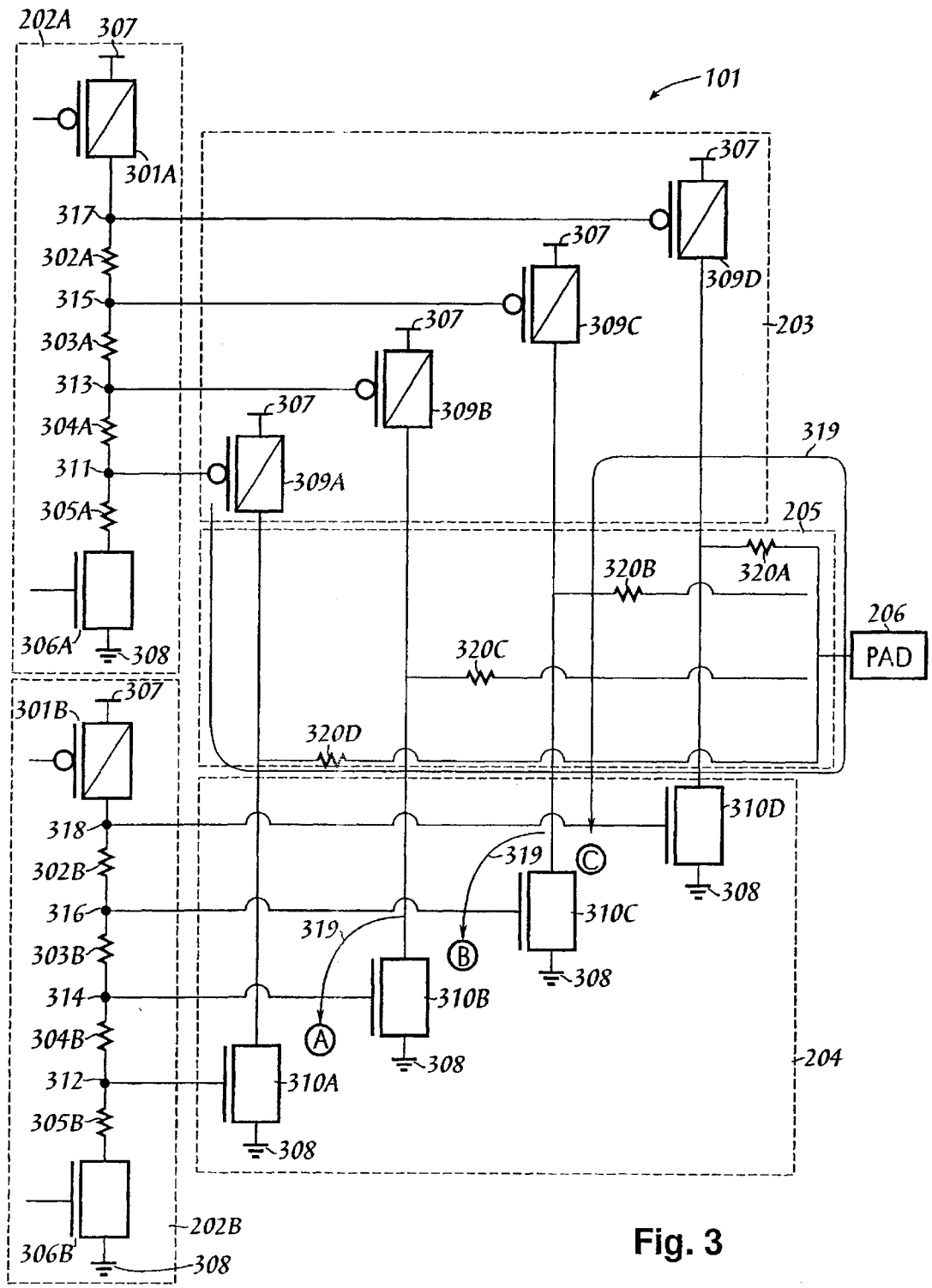
FIG. 3 illustrates the internal circuitry of the driver in accordance with the present invention.

FIG. 3—Internal Circuitry of Driver

FIG. 3 illustrates an embodiment of the present invention of the internal circuitry of driver 101. As stated above, driver 101 may be configured such that the effective impedance of driver 101 may not appear to be substantially higher than the characteristic impedance of bus 102 thereby reducing jitter.

As stated above, slew rate controllers 202A–B may be configured to control the slew, i.e., rate, at which pad 206 switches. Slew rate controller 202A may comprise transistor 301A, e.g., p-channel Field Effect Transistor (PFET), coupled to power supply terminal 307 for receiving a source of operating potential or power supply voltage. Transistor 301A may be coupled to a stack of resistors, e.g., resistors 302A, 303A, 304A and 305A. The stack of resistors, e.g., resistors 302A, 303A, 304A and 305A, may be coupled to transistor 306A, e.g., n-channel Field Effect Transistor (NFET), coupled to ground 308. Slew rate controller 202B may be configured similarly as slew rate controller 202A. For example, slew rate controller 202B may comprise transistor 301B, e.g., p-channel Field Effect Transistor (PFET), coupled to power supply terminal 307 for receiving a source of operating potential or power supply voltage. Transistor 301B may be coupled to a stack of resistors, e.g., resistors 302B, 303B, 304B and 305B. The stack of resistors, e.g., resistors 302B, 303B, 304B and 305B, may be coupled to transistor 306B, e.g., n-channel Field Effect Transistor (NFET), coupled to ground 308. It is noted that slew rate controller 202A may function in substantially the same manner as slew rate controller 202B. It is further noted that slew rate controllers 202A–B may collectively or individually be referred to as slew rate controllers 202 or slew rate controller 202, respectively. It is further noted that slew rate controllers 202 may comprise different circuitry providing the same functionality as discussed herein and that FIG. 3 is illustrative.

Slew rate controller 202A may be coupled to pull-up driver 203 which may comprise a plurality of segmented transistors, e.g., transistors 309A–D, coupled to power supply terminal 307 for receiving a source of operating potential or power supply voltage. Each of the plurality of segmented transistors, e.g., transistors 309A–D, may be configured to be p-channel transistors, e.g., PFETs.

Slew rate controller 202B may be coupled to pull-down driver 204 which may comprise a plurality of segmented transistors, e.g., transistors 310A–D, coupled to ground 308. Each of the plurality of segmented transistors, e.g., transistors 310A–D, may be configured to be n-channel transistors, e.g., NFETs.

It is noted that pull-up driver 203 and pull-down driver 204 may each comprise the same number of segmented transistors. It is further noted pull-up driver 203 and pull-down driver 204 may each comprise a different number of segmented transistors than illustrated in FIG. 3. It is further noted pull-up driver 203 and pull-down driver 204 may be configured with different circuitry providing the same functionality as discussed herein.

Referring to FIG. 3, p-channel transistor 301 and n-channel transistor 306 of slew rate controller 202 may receive an input signal 201 (FIG. 2). If input signal 201 is high, then p-channel transistor 301 becomes deactivated, i.e., turns off, and n-channel transistor 306 becomes activated, i.e., turns on. Consequently, current may flow through the slew rate controller, i.e., resistors 302, 303, 304 and 305, to n-channel transistor 306.

Referring to slew rate controller 202A, upon n-channel transistor 306A becoming activated, the voltage level at node 311 starts to become low thereby activating, i.e., turning on, p-channel transistor 309A. Transistor 309A may be activated exponentially with an RC (Resistor-Capacitance) time constant where the resistance is the resistance of resistor 305A and the capacitance is the capacitance of the gate of transistor 309A. Referring to slew rate controller 202B, upon n-channel transistor 306B becoming activated, the voltage level at node 312 starts to become low thereby deactivating, i.e., turning off, n-channel transistor 310A. Transistor 310A may be deactivated exponentially with an RC (Resistor-Capacitance) time constant where the resistance is the resistance of resistor 305B and the capacitance is the capacitance of the gate of transistor 310A. The activating of p-channel transistor 309A and deactivating of n-channel transistor 310A may occur at substantially the same time.

Similarly, referring to slew rate controller 202A, the voltage level at node 313 starts to become low at a time after node 311. The voltage level at node 313 starts to become low at a time after node 311 becomes low since current is being pulled down through resistors 304A and 305A instead of simply resistor 305A by n-channel transistor 306A to discharge the capacitance of the gate of transistor 309B. Upon node 313 becoming low, p-channel transistor 309B becomes activated, i.e., turns on. P-channel transistor 309B may become activated at a later point in time than p-channel transistor 309A becoming activated since p-channel transistor 309B has a greater effective RC time constant than p-channel transistor 309A. That is, in order for n-channel transistor 306A to discharge the capacitance of the gate of transistor 309B versus the gate of transistor 309A, current may be pulled down through resistors 304A and 305A instead of simply resistor 305A. Referring to slew rate controller 202B, the voltage level at node 314 starts to become low at a time after node 312 becomes low since current is being pulled down through resistors 304B and 305B instead of simply resistor 305B by n-channel transistor 306B to discharge the capacitance of the gate of transistor 310B. Upon node 314 becoming low, n-channel transistor 310B becomes deactivated, i.e., turns off. N-channel transistor 310B may become deactivated at a later point in time than n-channel transistor 310A becoming deactivated since n-channel transistor 310B has a greater effective RC time constant than n-channel transistor 310A. That is, in order for n-channel transistor 306B to discharge the capacitance of the gate of transistor 310B versus the gate of transistor 310A, current may be pulled down through resistors 304B and 305B instead of simply resistor 305B. The activating of p-channel transistor 309B and deactivating of n-channel transistor 310B may occur at substantially the same time.

Similarly, referring to slew rate controller 202A, the voltage level at node 315 starts to become low at a time after node 313 becomes low since current is being pulled down through resistors 303A, 304A and 305A instead of simply resistors 304A and 305A by n-channel transistor 306A to discharge the capacitance of the gate of transistor 309C. Upon node 315 becoming low, p-channel transistor 309C becomes activated, i.e., turns on. P-channel transistor 309C may become activated at a later point in time than p-channel transistor 309B becoming activated since p-channel transistor 309C has a greater effective RC time constant than p-channel transistor 309B. Referring to slew rate controller 202B, the voltage level at node 316 starts to become low at a time after node 314 becomes low since current is being pulled down through resistors 303B, 304B and 305B instead of simply resistors 304B and 305B by n-channel transistor 306B to discharge the capacitance of the gate of transistor 310C. Upon node 316 becoming low, n-channel transistor 310C becomes deactivated, i.e., turns off. N-channel transistor 310C may become deactivated at a later point in time than n-channel transistor 310B becoming deactivated since n-channel transistor 310C has a greater effective RC time constant than n-channel transistor 310B. The activating of p-channel transistor 309C and deactivating of n-channel transistor 310C may occur at substantially the same time.

Similarly, referring to slew rate controller 202A, the voltage level at node 317 starts to become low at a time after node 315 becomes low since current is being pulled down through resistors 302A, 303A, 304A and 305A instead of simply resistors 303A, 304A and 305A by n-channel transistor 306A to discharge the capacitance of the gate of transistor 309D. Upon node 317 becoming low, p-channel transistor 309D becomes activated, i.e., turns on. P-channel transistor 309D may become activated at a later point in time than p-channel transistor 309C becoming activated since p-channel transistor 309D has a greater effective RC time constant than p-channel transistor 309C. Referring to slew rate controller 202B, the voltage level at node 318 starts to become low at a time after node 316 becomes low since current is being pulled down through resistors 302B, 303B, 304B and 305B instead of simply resistors 303B, 304B and 305B by n-channel transistor 306B to discharge the capacitance of the gate of transistor 310D. Upon node 318 becoming low, n-channel transistor 310D becomes deactivated, i.e., turns off. N-channel transistor 310D may become deactivated at a later point in time than n-channel transistor 310C becoming deactivated since n-channel transistor 310D has a greater effective RC time constant than n-channel transistor 310C. The activating of p-channel transistor 309D and deactivating of n-channel transistor 310D may occur at substantially the same time.

Subsequently, the activation of p-channel transistors, e.g., p-channel transistors 309A–D, in pull-up driver 203 may occur in a staggered fashion where p-channel transistor 309A may be activated first followed by the activation at a later point in time of p-channel transistor 309B followed by the activation at a later point in time of p-channel transistor 309C followed by the activation at a later point in time of p-channel transistor 309D. Similarly, the associated n-channel transistors, e.g., n-channel transistors 310A–D, in pull-down driver 204 may occur in a staggered fashion where n-channel transistor 310A may be deactivated first followed by the deactivation at a later point in time of n-channel transistor 310B followed by the deactivation at a later point in time of n-channel transistor 310C followed by the deactivation at a later point in time of n-channel transistor 310D.

As stated above, the activation of a p-channel transistor, e.g., p-channel transistor 309A, in pull-up driver 203 may occur at substantially the same time as the deactivation of an associated n-channel transistor, e.g., n-channel transistor 310A, in pull-down driver 204. By staggering the activation of p-channel transistors in pull-up driver 203 and associated deactivation of n-channel transistors in pull-down driver 204, a portion of the current as indicated by line 319 may flow from pull-up driver 203 through the impedance 205 of the output stage of driver 101 and then through pull-down driver 204 thereby producing an effective impedance of driver 101 during the switching of pad 206 that does not appear to be substantially higher than the characteristic impedance of bus 102 thereby reducing jitter. That is, the variation of the effective impedance of driver 101 may appear to be bounded during switching of pad 206 thereby producing a reflection coefficient that is below a predetermined value. When the reflection coefficient is less than the predetermined value, then a signal reflected from receiver 103, e.g., I/O device, may be terminated at driver 101. The other portion of the current may flow from pull-up driver 203 through the impedance 205 of the output stage of driver 101 and then out to pad 206.

Referring to FIG. 3, the impedance 205 of the output stage may be represented as a plurality of resistors 320A–D where resistor 320A may represent the resistance from pad 206 to transistors 309D, 310D. Resistor 320B may represent the resistance from pad 206 to transistors 309C, 310C. Resistor 320C may represent the resistance from pad 206 to transistors 309B, 310B. Resistor 320D may represent the resistance from pad 206 to transistors 309A, 310A.

As p-channel transistor 309A becomes activated and the associated n-channel transistor 310A becomes deactivated, a portion of the current as indicated by line 319 may flow across a shunt path from pull-up driver 203 through the impedance 205 of the output stage of driver 101 and then through transistors 310D, 310C and 310B in pull-down driver 204 to a point labeled "A". When p-channel transistor 309B becomes activated and the associated n-channel transistor 310B becomes deactivated, a lesser amount of current as indicated by line 319 may flow across the shunt path from pull-up driver 203 through the impedance 205 of the output stage of driver 101 and then through transistors 310D and 310C in pull-down driver 204 than when only p-channel transistor 309A is activated and the associated n-channel transistor 310A is deactivated. For example, a portion of the current as indicated by line 319 may flow across a shunt path from pull-up driver 203 through the impedance 205 of the output stage of driver 101 and then through transistors 310D and 310C in pull-down driver 204 to a point labeled "B."

Similarly, when p-channel transistor 309C becomes activated and the associated n-channel transistor 310C becomes deactivated, a lesser amount of current as indicated by line 319 may flow across the shunt path from pull-up driver 203 through the impedance 205 of the output stage of driver 101 and then through transistor 310D in pull-down driver 204 than when channel transistors 309A, 309B are activated and the associated n-channel transistors 310A, 310B are deactivated. For example, a portion of the current as indicated by line 319 may flow across the shunt path from pull-up driver 203 through the impedance 205 of the output stage of driver 101 and then through transistor 301D in pull-down driver 204 to a point labeled "C."

When all p-channel transistors, e.g., p-channel transistors 309A–D, in pull-up driver 203 are activated and the associated n-channel transistors, e.g., n-channel transistors 310A–D, in pull-down driver 204 are deactivated, the current may simply flow from pull-up driver 203 through the impedance 205 of the output stage of driver 101 and then out to pad 206.

As stated above, by staggering the activation of p-channel transistors, e.g., channel transistors 309A–D, in pull-up driver 203 and the deactivation of the associated n-channel transistors, e.g., n-channel transistors 310A–D, in pull-down driver 204, the effective impedance of driver 101 may not appear to be substantially higher than the characteristic impedance of bus 102 thereby reducing jitter.

It is noted that the internal circuitry of driver 101 is not to be limited by the description above describing transistors in slew rate controllers 202, pull-up driver 203 and pull-down driver 204 as being of a p-type, i.e., p-channel transistor, or an n-type, i.e., n-channel transistor. A person of ordinary skill in the art would recognize that driver 101 may be configured in a different manner where a p-type transistor may be an n-type transistor and vice-versa. It is further noted that the above description describes driver 101 with an effective impedance that may be bounded upon receiving a high input signal 201 during the transitions of driver 101 switching pad 206 from low to high. It is noted that the variation of the effective impedance of driver 101 may also appear to be bounded upon receiving a low input signal 201 during the transitions of driver 101 switching pad 206 from high to low. It is further noted that driver 101 is exemplary of a non-inverting driver and that driver 101 may be configured to be an inverting driver with the same functionality as described above.

Figure 4:
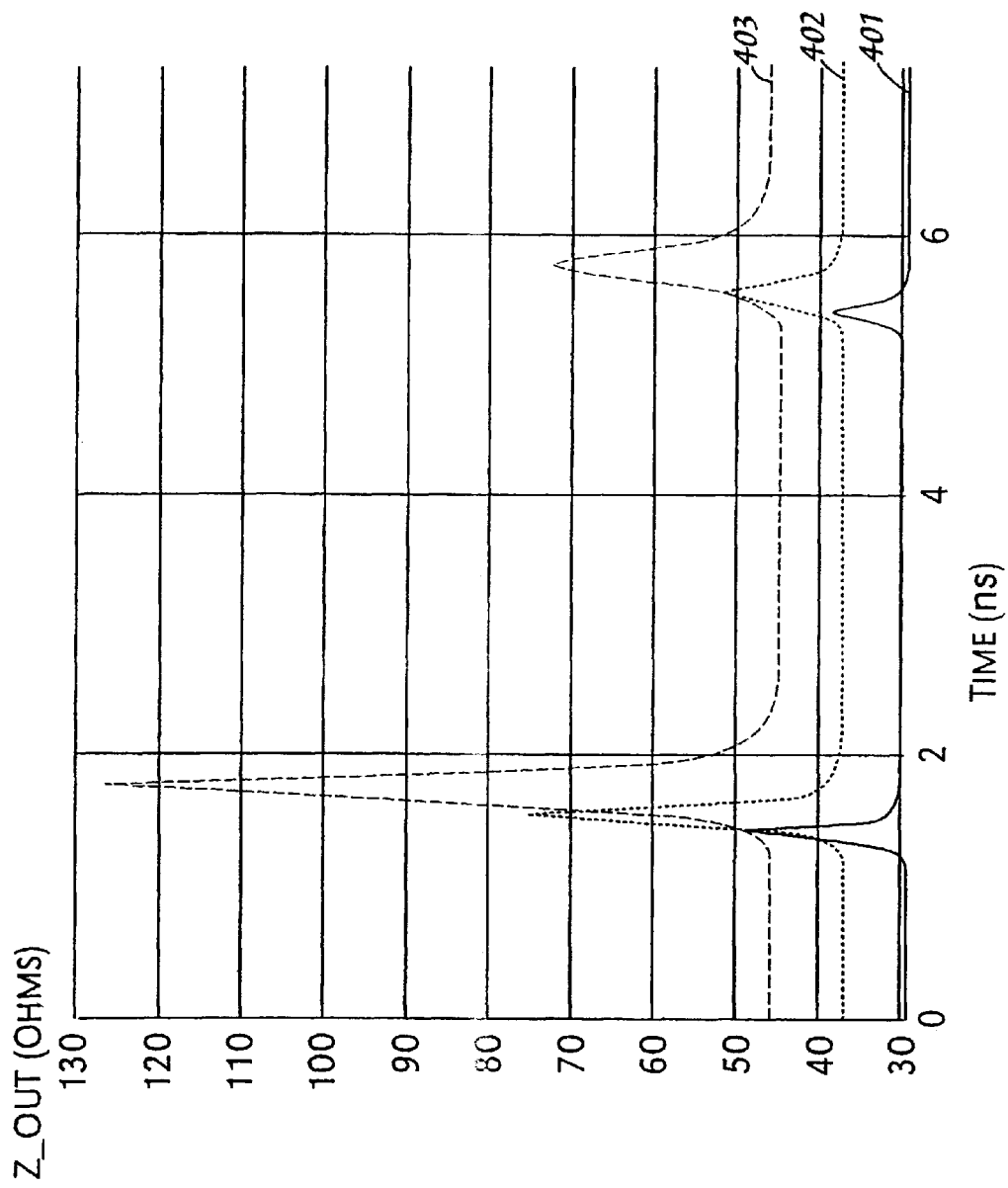
FIG. 4 are plots showing the effective impedance of the driver with respect to time in different cases in accordance with the present invention.

FIG. 4—Plots of Output Impedance of Driver Versus Time

FIG. 4 illustrates three plots of various cases, i.e., best case, nominal case, worst case, of the output impedance of a driver, such as driver 101, that is a nominal thirty-five (35) ohm driver, with respect to time measured in nanoseconds (ns).

Referring to FIG. 4, under the best case, as illustrated in plot 401, the effective output impedance of the driver may jump to approximately 48 ohms from approximately 28 ohms when the driver switches from low to high at about 1.6 ns. Furthermore, under the best case, the effective output impedance of the driver may jump to approximately 35 ohms from approximately 28 ohms when the driver switches from high to low at about 5.4 ns. Under the nominal case, as illustrated in plot 402, the effective output impedance of the driver may jump to approximately 75 ohms from approximately 35 ohms when the driver switches from low to high at about 1.6 ns. Furthermore, under the nominal case, the effective output impedance of the driver may jump to approximately 51 ohms from approximately 35 ohms when the driver switches from high to low at about 5.4 ns. Under the worst case, as illustrated in plot 403, the effective output impedance of the driver may jump to approximately 126 ohms from approximately 45 ohms when the driver switches from low to high at about 1.6 ns. Furthermore, under the nominal case, the effective output impedance of the driver may jump to approximately 72 ohms from approximately 45 ohms when the driver switches from high to low at about 5.4 ns. As illustrated in plots 401–403, the effective output impedance of a driver, such as driver 101, implementing an internal circuitry as illustrated in FIG. 3, may be substantially constant during state transitions. Since the variation of the effective impedance of the driver may be bounded during state transitions, a reflection coefficient may be below a predetermined value. That is, since the effective impedance of the driver may have a bounded variation about the nominal impedance as illustrated in FIG. 4, the reflection coefficient may be below the predetermined value thereby reducing jitter. As stated above, the predetermined value for the reflection coefficient may establish the maximum tolerable jitter. A reflection coefficient value greater than the predetermined value may represent a case when jitter is not sufficiently reduced. A reflection coefficient value less than the predetermined value may represent a case when jitter is sufficiently reduced.

Figure 5:
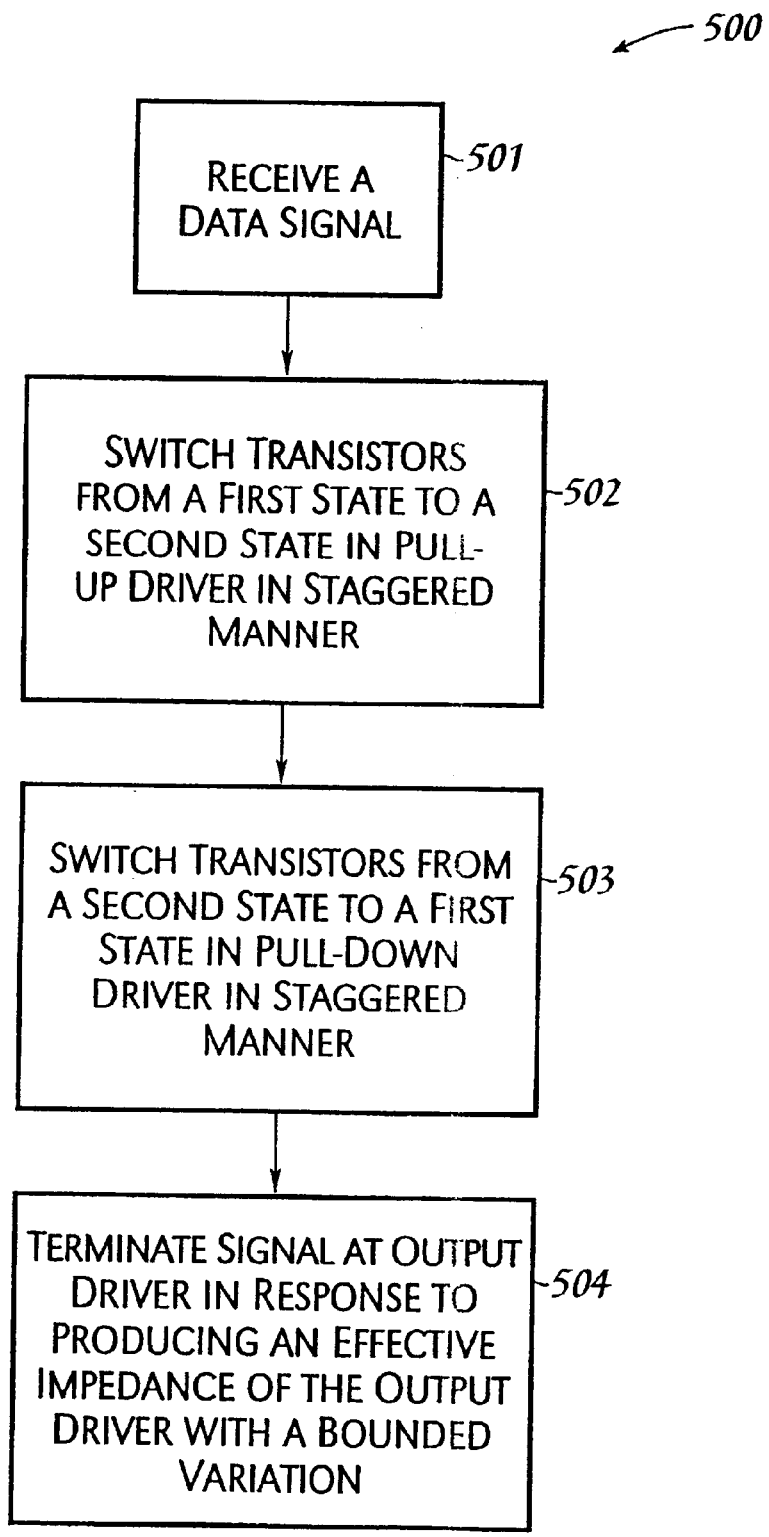
FIG. 5 is a flowchart of a method for reducing a reflection coefficient below a predetermined value thereby reducing jitter.

FIG. 5—Method for Reducing a Reflection Coefficient Below a Predetermined Value FIG. 5 is a flowchart of one embodiment of the present invention of a method 500 for reducing a reflection coefficient below a predetermined value during state transitions of driver 101 (FIG. 1). When the variation of the effective impedance of driver 101 appears to be bounded during switching of pad 206 (FIG. 3), the reflection coefficient may be below a predetermined value thereby reducing jitter.

In step 501, driver 101 may be configured to receive a data signal. As stated above, driver 101 may comprise slew control resistor stacks 202A–B (FIG. 3) configured to control the slew, i.e., rate, at which pad 206 switches. Slew control resistor stack 202A may be coupled to pull-up driver 203 (FIG. 3) which may comprise a plurality of segmented transistors, e.g., transistors 309A–D, coupled to power supply terminal 307 for receiving a source of operating potential or power supply voltage. Each of the plurality of segmented transistors, e.g., transistors 309A–D, may be configured to be p-channel transistors, e.g., PFETs. Slew control resistor stack 202B may be coupled to pull-down driver 204 (FIG. 3) which may comprise a plurality of segmented transistors, e.g., transistors 310A–D, coupled to ground 308. Each of the plurality of segmented transistors, e.g., transistors 310A–D, may be configured to be n-channel transistors, e.g., NFETs.

In step 502, each of the plurality of segmented transistors, e.g., transistors 309A–D, in pull-up driver 203 may be configured to switch from a first state, e.g., deactivated state, to a second state, e.g., activated state, in a staggered manner. For example, referring to FIG. 3, transistor 309A may be activated first followed by the activation of transistor 309B at a later point in time followed by the activation of transistor 309C at a later point in time followed by the activation of transistor 309D at a later point in time.

As stated above, each of the plurality of transistors in pull-up driver 203 may be associated with a particular transistor in pull-down driver 204. When a particular transistor in pull-up driver 203 becomes activated, the associated transistor in pull-down driver 204 becomes deactivated at substantially the same point in time. Subsequently, in step 503, each of the plurality of segmented transistors, e.g., transistors 310A–D, in pull-down driver 204 may be configured to switch from the second state, e.g., activated state, to the first state, e.g., deactivated state, in a staggered manner. For example, referring to FIG. 3, transistor 310A may be deactivated first followed by the deactivation of transistor 310B at a later point in time followed by the deactivation of transistor 310C at a later point in time followed by the deactivation of transistor 310D at a later point in time.

As stated above, by staggering the activation of the transistors in pull-up driver 203 and deactivation of the transistors in pull-down driver 204, a portion of the current as indicated by line 319 (FIG. 3) may flow from pull-up driver 203 through the impedance 205 (FIG. 3) of the output stage of driver 101 and then through pull-down driver 204 thereby reducing the effective impedance of driver 101 during switching of pad 206. That is, the effective impedance may not appear to be substantially higher than the characteristic impedance of bus 102 thereby reducing jitter. The other portion of the current may flow from pull-up driver 203 through the impedance 205 of the output stage of driver 101 and then out to pad 206.

In step 504, a signal reflected from a receiver 103 (FIG. 1), e.g., I/O device, may be terminated at driver 101 during switching of pad 206 since the effective impedance of driver 101 may not appear to be substantially higher than the characteristic impedance of bus 102 during switching of pad 206. That is, the variation of the effective impedance of driver 101 may appear to be bounded during switching of pad 206 thereby producing a reflection coefficient that is below a predetermined value. When the reflection coefficient is less than the predetermined value, then a signal reflected from receiver 103, e.g., I/O device, may be terminated at driver 101. That is, when the reflection coefficient is less than the predetermined value, then not all of the energy in the reflected signal gets reflected back towards receiver 103

It is noted that method 500 may be executed in a different order presented and that the order presented in the discussion of FIG. 5 is illustrative. It is further noted that certain steps may be executed almost concurrently.

Although the system and method are described in connection with several embodiments, it is not intended to be limited to the specific forms set forth herein, but on the contrary, it is intended to cover such alternatives, modifications and equivalents, as can be reasonably included within the spirit and scope of the invention as defined by the appended claims. It is noted that the headings are used only for organizational purposes and not meant to limit the scope of the description or claims.

What is claimed is:

1. An integrated circuit, comprising:

a pad; and a driver coupled to said pad, wherein said driver comprises:

an input configured to receive a data signal;

a pull-up driver, wherein said pull-up driver is configured to drive said pad to a logic high voltage level, wherein said pull-up driver comprises a plurality of transistors;

a pull-down driver, wherein said pull-down driver is configured to drive said pad to a logic low voltage level, wherein said pull-down driver comprises a plurality of transistors; and a first and a second controller to control a slew rate of an outpost signal at said pad, wherein each of said first and second controller comprises a first transistor, wherein a drain of said first transistor is coupled to a stack of resistors, wherein said stack of resistors is coupled to a drain of a second transistor;

wherein each of said plurality of transistors in said pull-up driver is coupled to a particular node in said first controller, wherein a first transistor in said pull-up driver is coupled to a first node between a first and a second resistor in said first controller, wherein said first resistor is coupled to said second transistor in said first controller, wherein said second resistor is coupled to said first resistor in said first controller, wherein a second transistor in said pull-up driver is coupled to a second node between said second resistor and a third resistor in said first controller, wherein said third resistor is coupled to said second resistor in said first controller wherein said first transistor in said pull-up driver is switched from a first state to a second state prior to a point in time when said second transistor in said pull-up driver is switched from said first state to said second state;

wherein each of said plurality of transistors in said pull-up driver are switched from said first state to said second state in a staggered manner, wherein each of said plurality of transistors in said pull-down driver are switched from said second state to said first state in said staggered manner, wherein in response to switching each of said plurality of transistors in said pull-up driver from said first state to said second state in said staggered manner and in response to switching each of said plurality of transistors in said pull-down driver from said second state to said first state in said staggered manner a portion of current flows from said pull-up driver to said pull-down driver thereby producing an effective impedance of said driver to sufficiently reduce a reflection coefficient of said effective impedance of said driver below a predetermined value during switching of the outpost signal at said pad.

2. The integrated circuit as recited in claim 1, wherein each of said plurality of transistors in said pull-down driver is coupled to a particular node in said second controller, wherein a first transistor in said pull-down driver is coupled to a first node between a first and a second resistor in said second controller, wherein said first resistor is coupled to said second transistor in said second controller, wherein said second resistor is coupled to said first resistor in said second controller, wherein a second transistor in said pull-down driver is coupled to a second node between said second resistor and a third resistor in said second controller, wherein said third resistor is coupled to said second resistor in said second controller, wherein said first transistor in said pull-down driver is switched from said second state to said first state prior to a point in time when said second transistor in said pull-down driver is switched from said second state to said first state.

* * * * *